United States Patent
Cheng et al.

(10) Patent No.: US 9,520,677 B2
(45) Date of Patent: *Dec. 13, 2016

(54) FLIPPABLE ELECTRICAL CONNECTOR

(71) Applicant: FOXCONN INTERCONNECT TECHNOLOGY LIMITED, Grand Cayman (KY)

(72) Inventors: Chih-Pi Cheng, New Taipei (TW); Wen He, Shenzhen (CN); Quan Wang, Shenzhen (CN); Feng Zeng, Shenzhen (CN)

(73) Assignee: FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

This patent is subject to a terminal disclaimer.

(21) Appl. No.: 15/205,006

(22) Filed: Jul. 8, 2016

(65) Prior Publication Data

US 2016/0322753 A1    Nov. 3, 2016

Related U.S. Application Data

(63) Continuation-in-part of application No. 15/169,004, filed on May 31, 2016, which is a continuation-in-part (Continued)

(30) Foreign Application Priority Data

Oct. 27, 2015    (CN) ............... 2015 2 0835946 U (51) Int. Cl.
*H01R 24/00*    (2011.01)
*H01R 13/6471*    (2011.01)
(Continued)

(52) U.S. Cl.
CPC ........ *H01R 13/6471* (2013.01); *H01R 13/631* (2013.01); *H01R 24/64* (2013.01); *H01R 2107/00* (2013.01)

(58) Field of Classification Search
CPC .................. H01R 23/7073; H01R 23/7005
(Continued)

(56) References Cited

U.S. PATENT DOCUMENTS

| 5,073,130 A | 12/1991 | Nakamura |
| 6,755,689 B2 | 6/2004 | Zhang et al. |

(Continued)

FOREIGN PATENT DOCUMENTS

| CN | 201029143 Y | 2/2008 |
| CN | 201230066 Y | 4/2009 |

(Continued)

OTHER PUBLICATIONS

USB Type-C Specification 0.9c05-20140518.
(Continued)

*Primary Examiner* — Phuongchi T Nguyen
(74) *Attorney, Agent, or Firm* — Wei Te Chung; Ming Chieh Chang (57) ABSTRACT

A plug connector includes a connector body defining a front mating cavity with a first inner side and a second inner side opposite to the first inner side, and a rear cable supporting platform with a first surface and a second surface opposite to the first inner side and a plurality of terminals. The terminals include two rows of contacting sections arranged along the first and second inner sides of the mating cavity and soldering legs extending to the platform to be welded to a cable. The soldering legs are arranged in one row and exposing to the first surface of the platform while the second surface of the platform has no soldering legs to be welded to the cable.

12 Claims, 14 Drawing Sheets

Related U.S. Application Data of application No. 14/698,876, filed on Apr. 29, 2015, now Pat. No. 9,356,400, and a continuation-in-part of application No. 14/667,632, filed on Mar. 24, 2015, said application No. 14/698,876 is a continuation-in-part of application No. 14/558,732, filed on Dec. 3, 2014, now Pat. No. 9,490,594, application No. 15/205,006, which is a continuation-in-part of application No. 14/542,550, filed on Nov. 15, 2014, now Pat. No. 9,350,126, and a continuation-in-part of application No. 14/497,205, filed on Sep. 25, 2014, now Pat. No. 9,472,910, application No. 15/205,006, which is a continuation-in-part of application No. 14/477,889, filed on Sep. 5, 2014, which is a continuation-in-part of application No. 15/205,006, which is a continuation-in-part of application No. 14/454,737, filed on Aug. 8, 2014, application No. 15/205,006, which is a continuation-in-part of application No. 14/337,180, filed on Jul. 21, 2014, now Pat. No. 9,318,853, application No. 15/205,006, which is a continuation-in-part of application No. 14/517,941, filed on Oct. 20, 2014, now Pat. No. 9,496,662.

(60) Provisional application No. 62/021,066, filed on Jul. 4, 2014, provisional application No. 62/002,934, filed on May 26, 2014, provisional application No. 62/026,046, filed on Jul. 18, 2014, provisional application No. 62/036,472, filed on Aug. 10, 2014, provisional application No. 61/977,115, filed on Apr. 9, 2014, provisional application No. 61/940,815, filed on Feb. 17, 2014, provisional application No. 61/943,310, filed on Feb. 22, 2014, provisional application No. 61/949,232, filed on Mar. 6, 2014, provisional application No. 61/917,363, filed on Dec. 18, 2013, provisional application No. 61/926,270, filed on Jan. 11, 2014, provisional application No. 61/916,147, filed on Dec. 14, 2013, provisional application No. 61/919,681, filed on Dec. 20, 2013, provisional application No. 61/875,096, filed on Sep. 8, 2013, provisional application No. 61/863,896, filed on Aug. 8, 2013, provisional application No. 61/866,037, filed on Aug. 14, 2013, provisional application No. 61/867,584, filed on Aug. 19, 2013, provisional application No. 61/856,077, filed on Jul. 19, 2013, provisional application No. 61/857,687, filed on Jul. 23, 2013, provisional application No. 61/899,276, filed on Nov. 3, 2013.

(51) Int. Cl.
*H01R 24/64* (2011.01)
*H01R 13/631* (2006.01)
*H01R 107/00* (2006.01)

(58) Field of Classification Search
USPC ............... 439/660, 626, 374, 377, 79, 733
See application file for complete search history.

(56) References Cited

U.S. PATENT DOCUMENTS

| | | | |
|---|---|---|---|
| 7,534,140 B2* | 5/2009 | Zheng | H01R 23/6873 439/607.01 |
| 7,758,379 B2 | 7/2010 | Chen | |
| 7,824,219 B2* | 11/2010 | Wang | H01R 13/65802 439/607.27 |
| 7,914,299 B2* | 3/2011 | Lee | G06K 19/07732 439/76.1 |
| 8,087,944 B2 | 1/2012 | Kumamoto et al. | |
| 8,517,773 B2 | 8/2013 | Lee et al. | |
| 8,968,031 B2 | 3/2015 | Simmel et al. | |
| 2009/0156027 A1 | 6/2009 | Chen | |
| 2010/0267261 A1 | 10/2010 | Lin | |
| 2013/0095702 A1 | 4/2013 | Golko et al. | |
| 2014/0024257 A1 | 1/2014 | Castillo et al. | |
| 2014/0302709 A1* | 10/2014 | Zhao | H01R 12/57 439/519 |
| 2015/0056839 A1 | 2/2015 | Zhang | |
| 2015/0162684 A1 | 6/2015 | Amini et al. | |
| 2015/0171562 A1 | 6/2015 | Gao et al. | |
| 2015/0214673 A1 | 7/2015 | Gao et al. | |
| 2015/0214674 A1 | 7/2015 | Simmel et al. | |
| 2015/0295362 A1 | 10/2015 | Tziviskos et al. | |
| 2015/0340813 A1 | 11/2015 | Ng et al. | |
| 2015/0340815 A1 | 11/2015 | Gao et al. | |
| 2015/0340825 A1 | 11/2015 | Ng et al. | |

FOREIGN PATENT DOCUMENTS

| | | |
|---|---|---|
| CN | 101573840 A | 11/2009 |
| CN | 201623280 U | 11/2010 |
| CN | 201741935 U | 2/2011 |
| CN | 201741937 U | 2/2011 |
| CN | 102437482 A | 5/2012 |
| CN | 102544812 A | 7/2012 |
| CN | 202423735 U | 9/2012 |
| CN | 202737282 U | 2/2013 |
| CN | 103081253 A | 5/2013 |
| CN | 201868687 U | 10/2013 |
| CN | 203242848 U | 10/2013 |
| CN | 203481540 U | 3/2014 |
| TW | M288035 | 2/2006 |
| TW | M357077 | 5/2009 |
| TW | I427870 | 6/2011 |
| TW | M414692 | 10/2011 |
| TW | M443957 | 12/2012 |
| TW | M453995 | 5/2013 |
| TW | M454654 | 6/2013 |
| WO | WO2009147791 | 12/2009 |
| WO | WO2013/020359 | 2/2013 |

OTHER PUBLICATIONS

Universal Serial Bus Type-C Cable and Connector Specification Revision 0.7 Working Draft Jan. xx, 2014.
Universal Serial Bus Type-C Cable and Connector Specification Revision 1.0 Aug. 11, 2014.

\* cited by examiner

FLIPPABLE ELECTRICAL CONNECTOR

CROSS REFERENCE TO CROSS REFERENCE TO RELATED APPLICATIONS

This application is a continuation in part of application Ser. No. 15/169,004 filed on May 31, 2016, which is a continuation-in application Ser. No. 14/698,876 filed on Apr. 29, 2015, which is a continuation-in-part of the co-pending application Ser. No. 14/667,632 filed Mar. 24, 2015 and Ser. No. 14/558,732 filed Dec. 3, 2014 and further claims the benefit of, and priority to, U.S. Provisional Patent Application No. 62/002,934, filed May 26, 2014, No. 62/021,066, filed Jul. 4, 2014, No. 62/026,046 filed Jul. 18, 2014, and No. 62/035,472 filed Aug. 10, 2014, the contents of which are incorporated entirely herein by reference.

BACKGROUND OF THE INVENTION

1. Field of the Invention

The present invention relates to an electrical connector, and more particularly to a flippable plug connector used with a receptacle connector.

2. Description of Related Art

USB 3.0 Promoter Group issues a new specification which establishes a new type connector named as USB Type-C Cable and Connector, on Aug. 11, 2014. In the specification, the Type-C plug enhances ease of use by being plug-able in either upside-up or upside-down directions. The plug connector connecting with a cable defines two types, one type is USB Full-Featured Type-C Plug Interface with 22 pins, another type is USB 2.0 Type-C plug with 14 pins. The plug connector is connected to the cable via paddle card, which will enhance the whole cost of the cable connector.

Hence, a new and simple electrical plug connector and the complementary receptacle connector are desired to improve those disclosed in the aforementioned proposal.

SUMMARY OF THE INVENTION

Accordingly, the object of the present invention is to provide to a plug connector comprises a connector body defining a front mating cavity with a first inner side and a second inner side opposite to the first inner side, and a rear cable supporting platform with a first surface and a second surface opposite to the first inner side and a plurality of terminals. The terminals comprise two rows of contacting sections arranged along the first and second inner sides of the mating cavity and soldering legs extending to the platform to be welded to a cable. The soldering legs are arranged in one row and exposing to the first surface of the platform while the second surface of the platform has no soldering legs to be welded to the cable.

Other objects, advantages and novel features of the invention will become more apparent from the following detailed description when taken in conjunction with the accompanying drawings.

DETAILED DESCRIPTION OF THE PREFERRED EMBODIMENT

Reference will now be made in detail to the preferred embodiment of the present invention.

Figure 1:
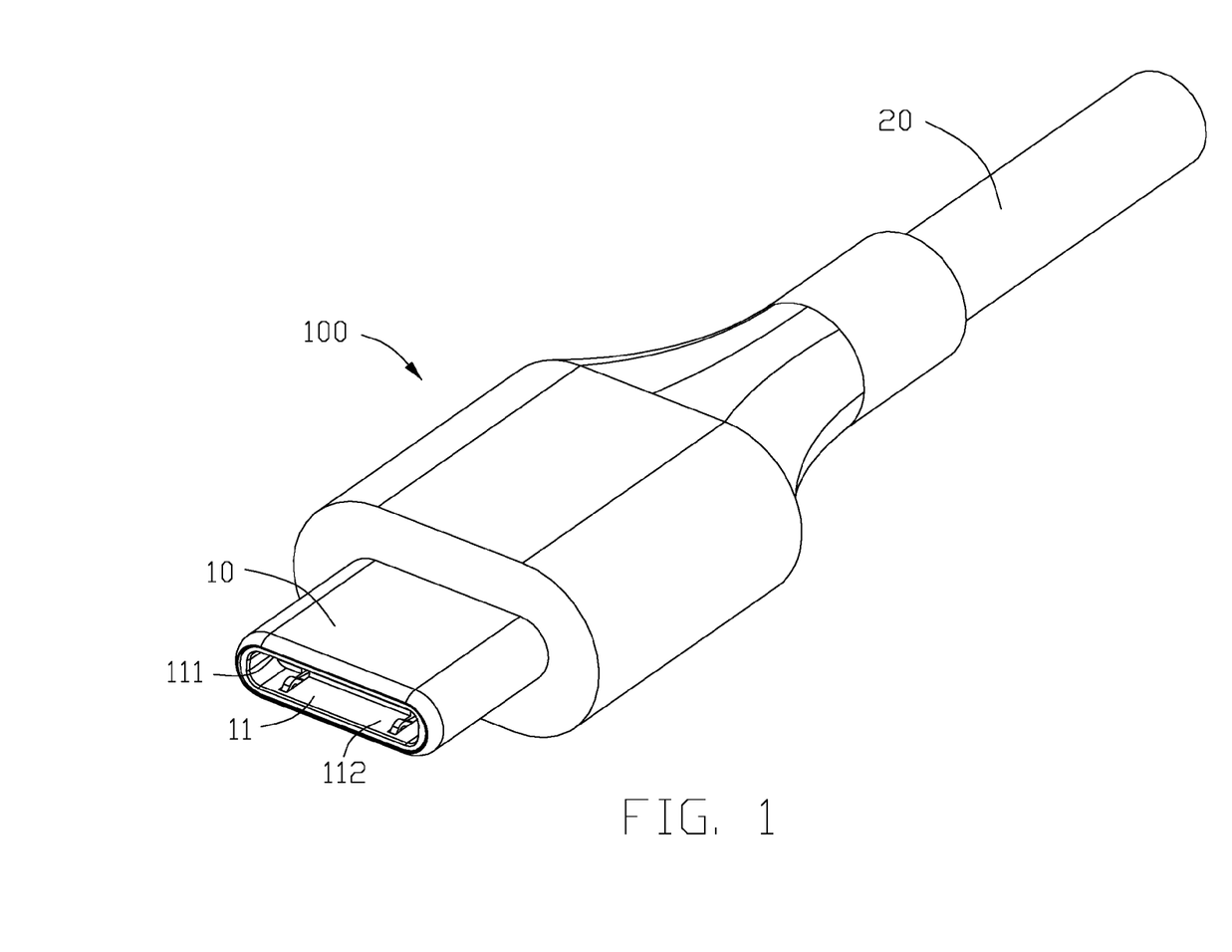
FIG. 1 is an assembled perspective view of a plug connector connecting with a cable of a first embodiment of the instant invention.
Figure 2:
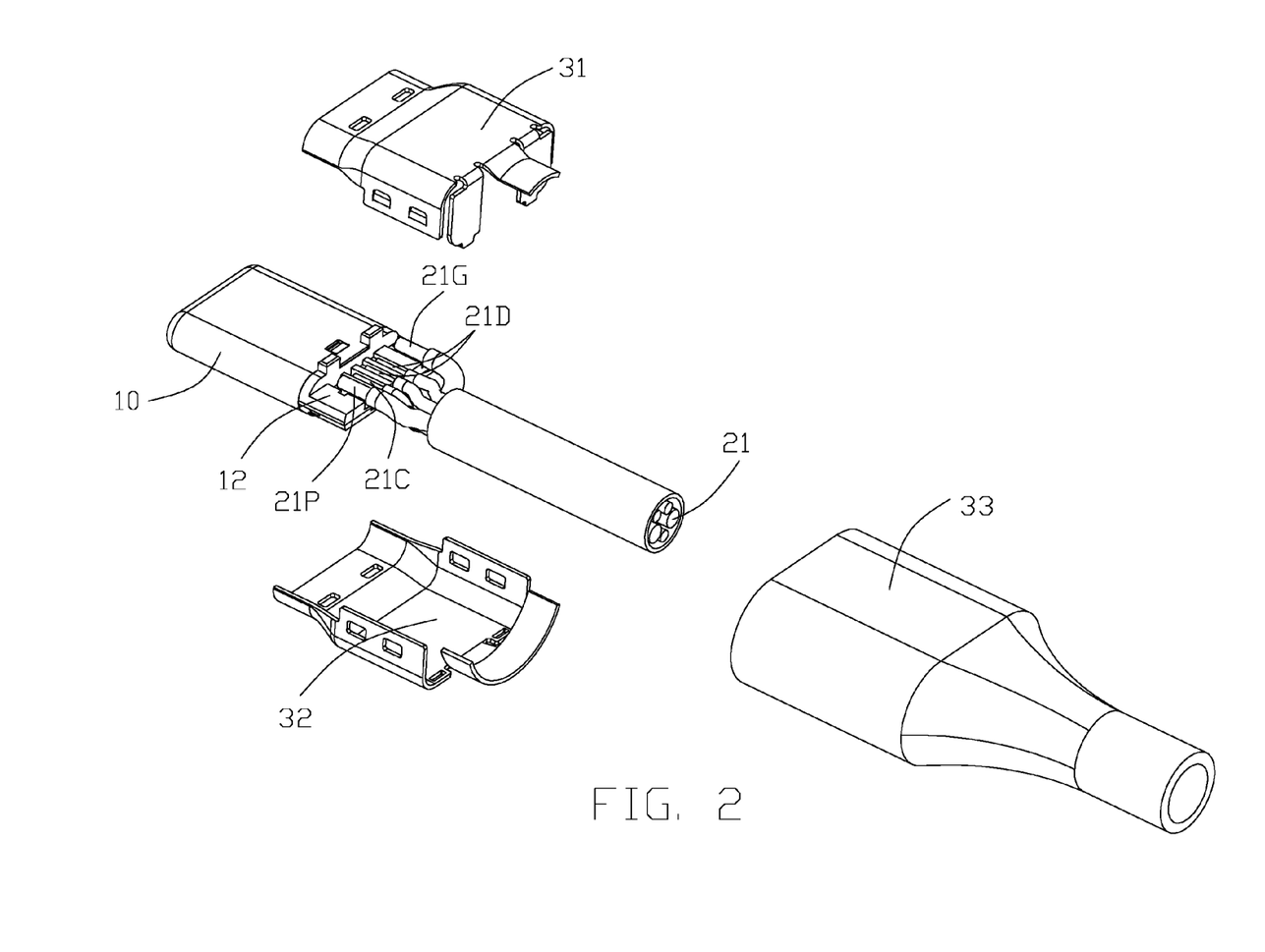
FIG. 2 is a partially exploded perspective view of the plug connector of FIG. 1.
Figure 3:
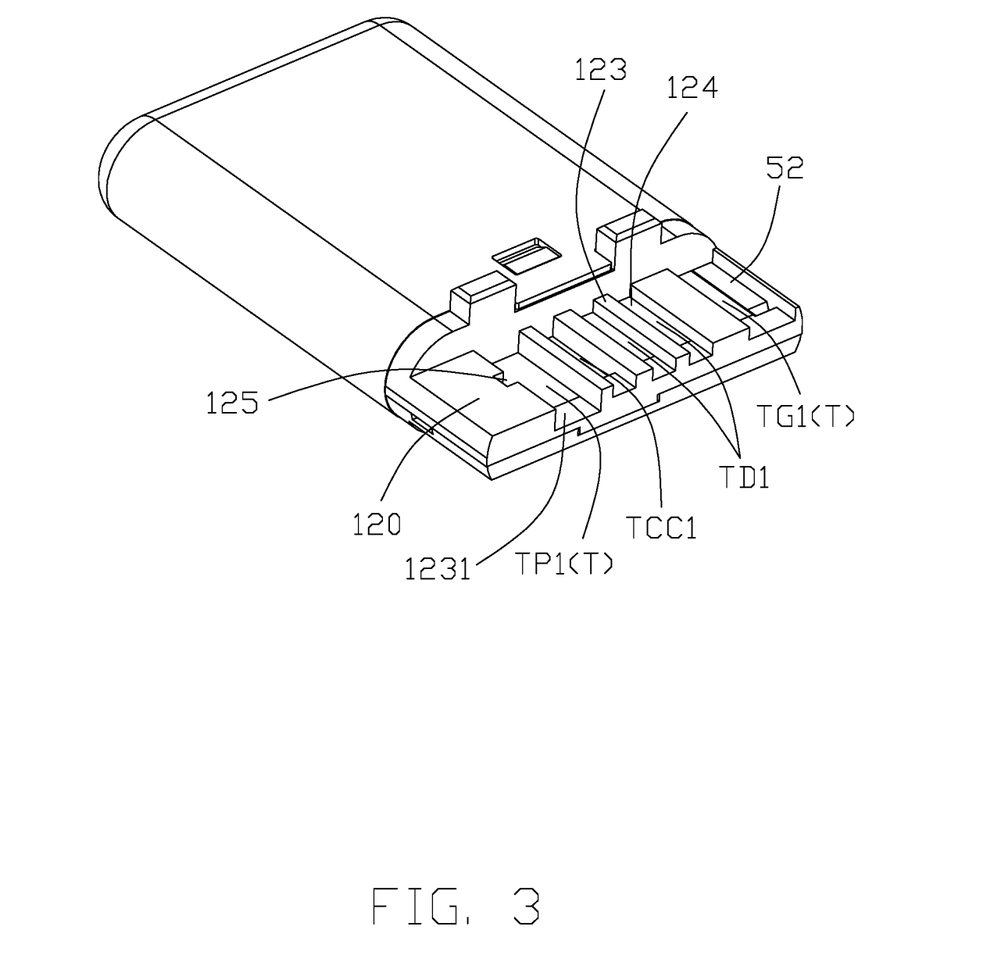
FIG. 3 is a rear and top perspective view of the connector body in FIG. 2.

Referring to FIG. 1 through FIG. 6, a USB Type C plug connector 100 of a first embodiment of this present invention is illustrated, which comprises a front connector body 10 and a rear cable 20 connecting with the connector body 10. The connector body 10 defines a front mating cavity 11 opening forwards and two rows of terminals 40 with contacting sections 41 along opposite first inner side 111 and second inner side 112 of the mating cavity 11 in a diagonally symmetrical manner. Referring to FIGS. 2 and 3, the connector body 10 defines a cable supporting platform 12 at a rear end thereof, and soldering legs TP1(T), TCC1, TD1, TG1(T) of the terminals 40 are exposed to the platform 12. Wires 21 of the cable 20 are disposed on the platform 12 and welded to the corresponding soldering legs. An upper metallic shell 31 and a lower metallic shell 32 enclose the platform 12. A molded cover 33 encloses the connector body 10 and the cable 20, thereby forming the plug connector 100.

Figure 4:
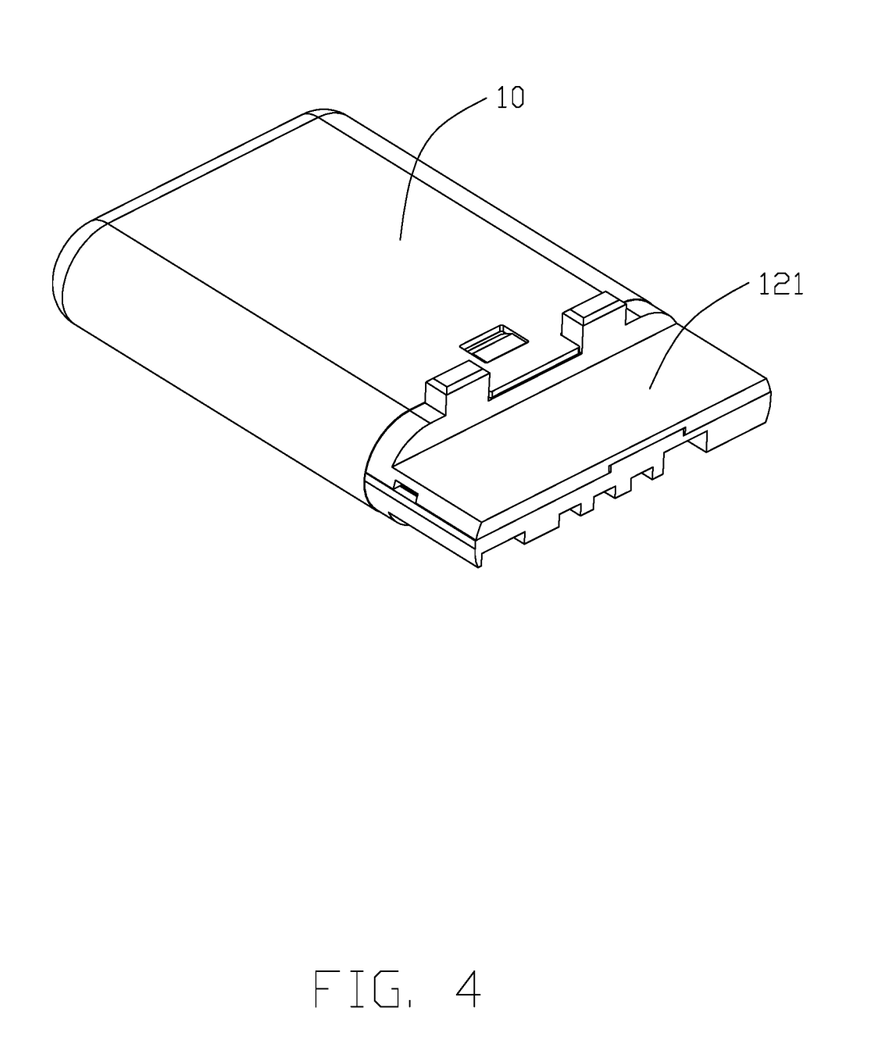
FIG. 4 is a rear and bottom perspective view of the connector body as shown in FIG. 3.
Figure 5:
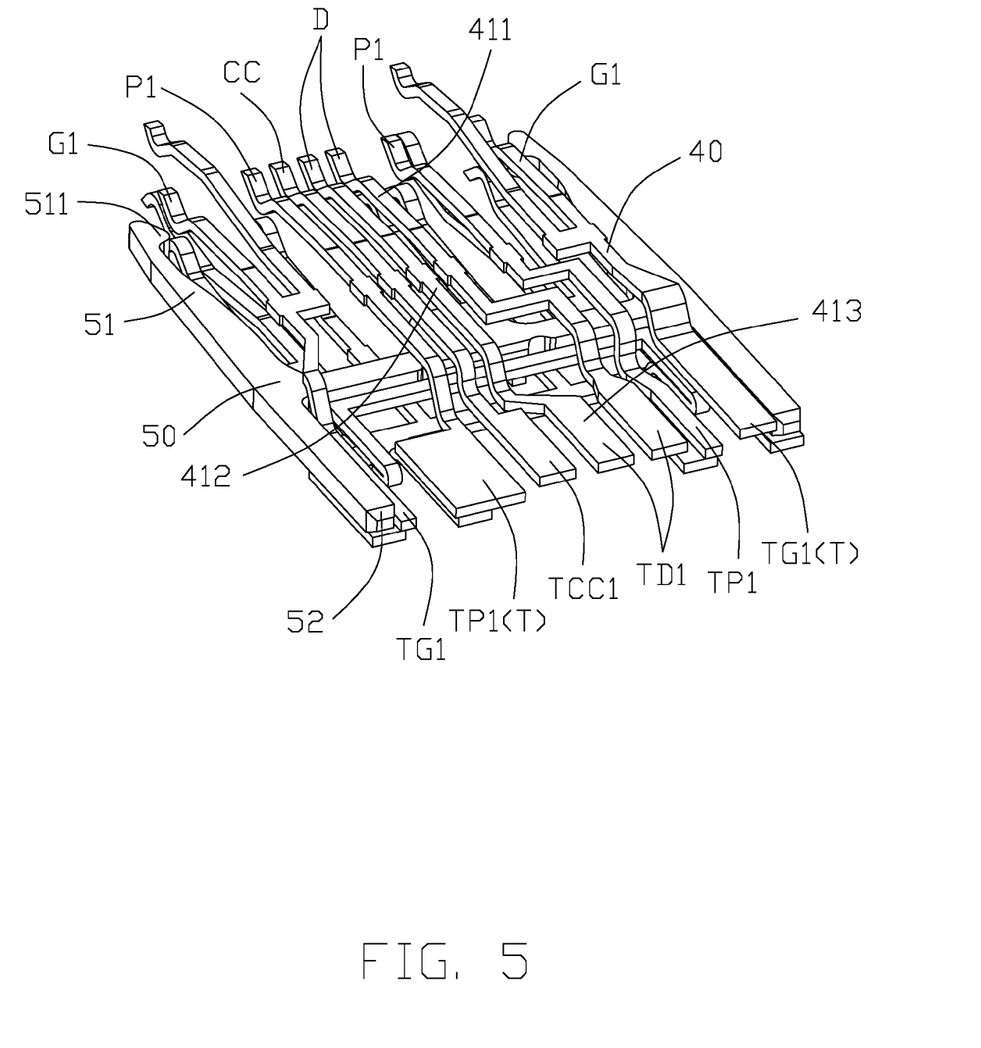
FIG. 5 is a rear and top perspective view of the terminals and the metallic latch of the connector body.
Figure 6:
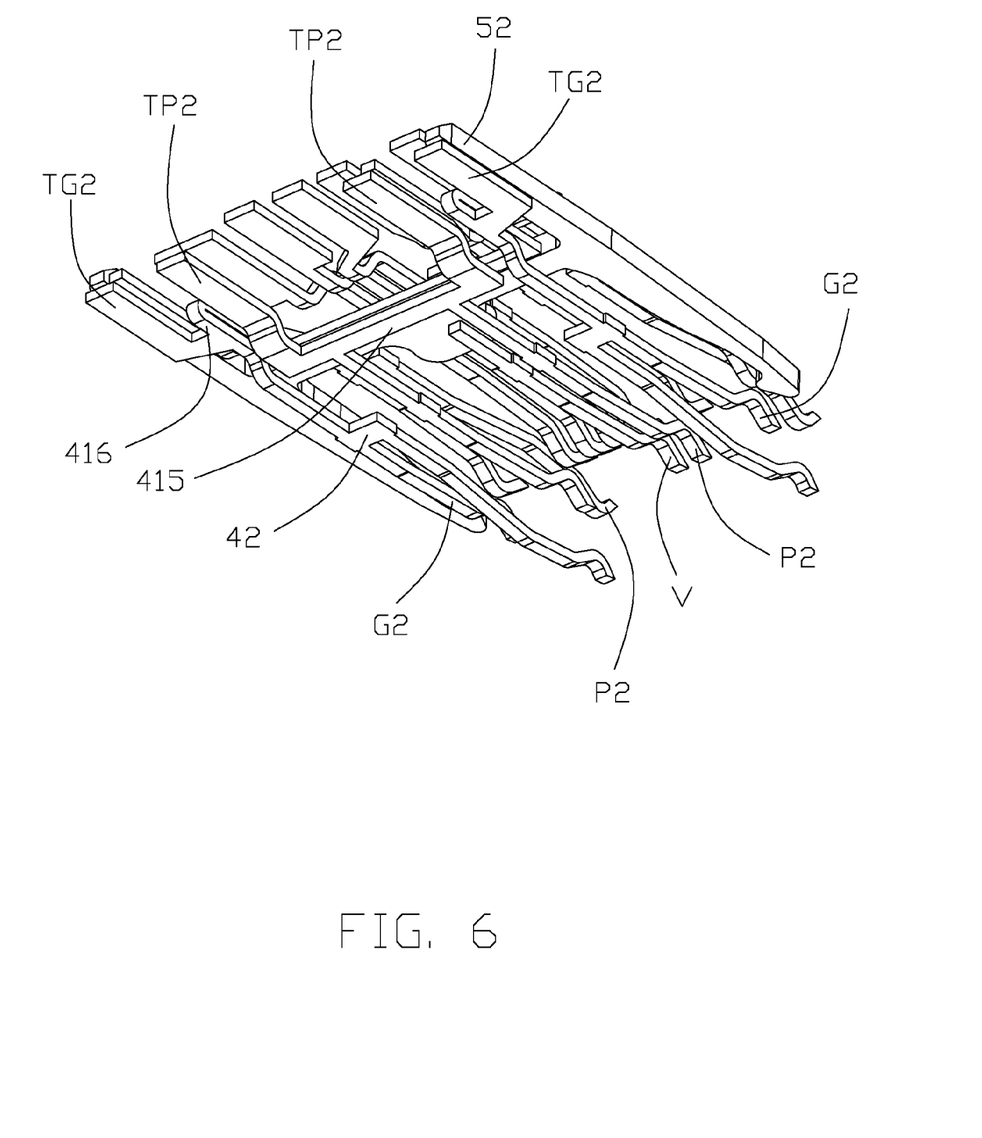
FIG. 6 is a rear and bottom perspective view of the terminals and the metallic latch of the connector body.
Figure 7:
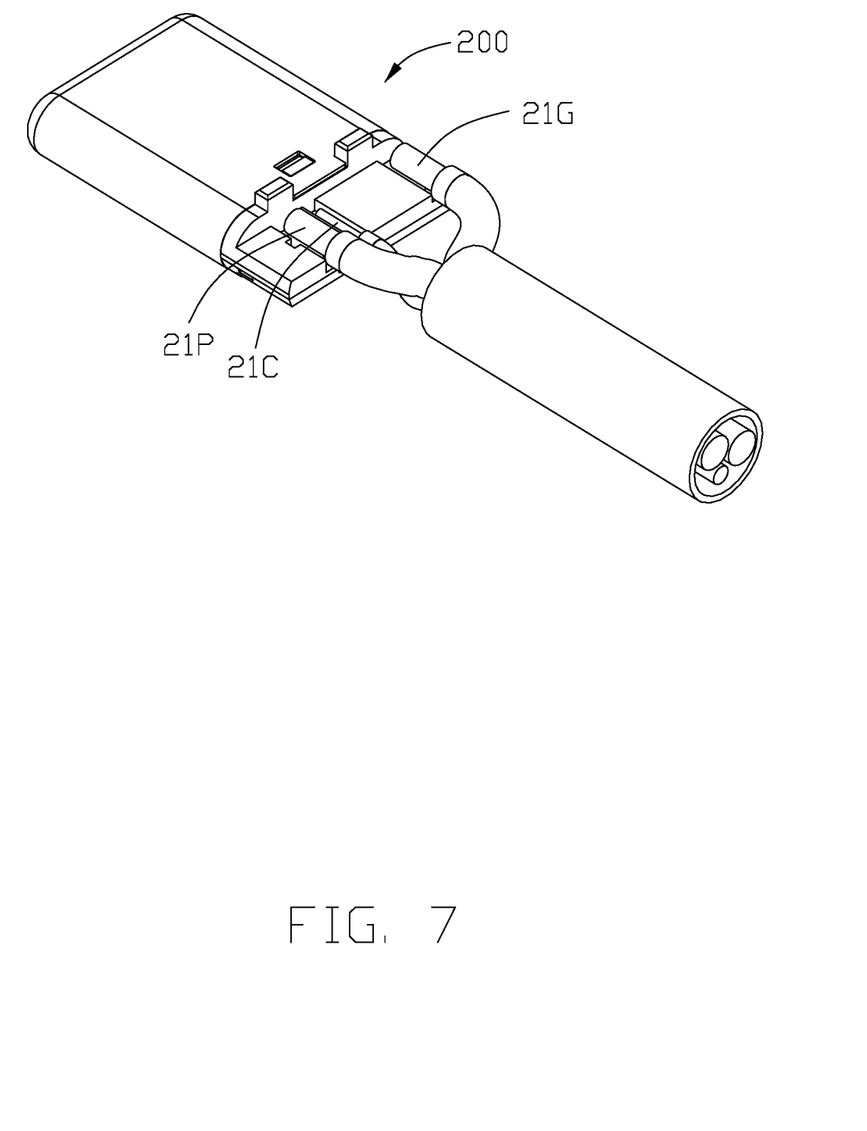
FIG. 7 is a rear and top perspective view of a plug connector connecting with a cable of a second embodiment of the instant invention without the outer molded cover.

Combination with FIGS. 3 and 4 referring to FIGS. 5 and 6, the terminals 40 are arranged to be complied with USB Type C 2.0, and divided to two rows, a first row includes a pair of grounding terminals G1, a pair of power terminals P1, a CC detecting terminal CC and a pair of USB 2.0 terminals D (including D+, D−), a second row includes a pair of grounding terminals G2, a pair of power terminals P2 and a Vconn detecting terminal V. The USB 2.0 terminals (D+, D−) and the detecting terminal CC are independent pin, each comprises a front contacting section 411, a rear leg section 413 and a middle section 412 connecting with the contacting section 411 and the leg section 413. The leg sections 413 of the USB 2.0 terminals (D+, D−) and the detecting terminal CC expose to the platform 12 and are functioned as said soldering legs TD1, TCC1 while the power and grounding terminals are not independent as described hereinafter.

The two pairs of power terminals P1, P2 have two pairs of contacting sections 411 (near to P1, P2 in FIGS. 5 and 6)

and two pairs of leg sections. A first leg section TP1 extends from each of the two first power contacting sections, a second leg section TP2 extends from each of the two second power contacting section and the second power terminals are further joined together with a bridge section 415. One of said two first power leg section TP1 bends toward the second power leg sections TP2 and touches with one second power leg section TP2 in a stacked form and another second power leg section TP2 bends toward another first power leg section TP1 so that said four power leg sections are electrically connecting with each other and only one first leg section labeled as TP1(T) exposes to the first surface 120, that is, the four power contacting sections share a same power soldering leg TP1(T). The first power leg section TP1 exposes to a first surface 120 and is functioned as a power soldering leg TP1(T).

A first grounding leg section TG1 extends from a rear end of each first grounding contacting sections (near to G1 in FIGS. 5 and 6), a second grounding leg section TG2 extends from a rear end of the second grounding contacting sections (near to G2 in FIGS. 5 and 6), two second grounding leg sections TG2 further are joined together with a second bridge section 416. The first and second grounding leg sections TP1, TP2 are stacked with each other in the vertical direction so that the four grounding leg section are electrically connecting with each other. Only one first grounding leg section labeled as TG1(T) is exposed to the first surface 120 which is functioned as a grounding soldering leg TG1(T). That is, the four grounding contacting sections share a same grounding soldering leg TP1(T). Other leg sections of the power terminals and grounding terminals are wholly embedded in the platform 12.

The connector body 10 further includes a H-shape metallic latch 50, which includes a pair of side arms 51 with locking heads 511 projecting into the mating cavity 11 and two leg sections 52. The leg sections 52 and the first grounding leg sections TG1 are located side by side and abut against each other. The second grounding leg sections TG2 are stacked with the leg sections 52 in a vertical direction. Understandingly, the grounding soldering leg may be the first grounding leg section TG1, the second grounding leg section TG2 or the leg section 52 of the latch. Referring to FIGS. 3 and 4, the first surface 120 and the first inner side 111 of the mating cavity 11 are located at a same side of the connector body 10. Therefore, the first grounding leg section TG1 may be the best choice for manufacturing a same row of the terminals since the first grounding contacting section (near to G1 in FIGS. 5 and 6) and the detecting contacting section (near to CC in FIGS. 5 and 6) are located at a same side of the mating cavity 11 described hereinafter.

In the preferred embodiment, the contacting sections 411 of the terminals 40 includes a pair of USB 2.0 signal contacting sections, a pair of power contacting sections, a pair of first grounding contacting sections and a detecting contacting section commonly located at the first inner side 111 of the mating cavity 11, and a pair of second power contacting sections and a pair of second grounding contacting sections commonly located at the second inner side 112 of the mating cavity 11. The first and second power/grounding contacting sections are aligned with each other in the vertical direction. The soldering legs includes a pair of signal soldering legs TD1 respectively extending from the signal contacting sections, only one power soldering leg TP1(T) extending from the first and second power contacting sections, only one grounding soldering leg TG1(T) extending from the first and second grounding contacting sections and one detecting soldering leg TCC1 extending from the detecting contacting section. The detecting soldering leg TCC1 is located beside the pair of the signal soldering legs TD1, the grounding soldering leg TG1(T) and the power soldering leg TP1(T) are located at opposite sides of the detecting soldering leg TCC1 and the pair of the signal soldering legs TD1. Referring to FIG. 2, the wires 21 of the cable 20 includes a power wire 21P, a grounding wire 21O a pair of signal wires 21D, and a CC detecting wire 21C which are weldingly connecting with the corresponding soldering legs one by one. Understandingly, the wires 21 are arranged upon a same surface, i.e., the first surface 120 of the platform 12, which will facility the soldering process of the wires 21 to the soldering legs. Referring to FIG. 3, the first surface 120 further defines a plurality of recesses 124 partitioned by ribs 123 and running rearwards through the platform. The soldering legs are flushed with the inner bottom 1231 of the recess 124. Therefore, the wires 21 are received and limited in the recesses 124. The power and grounding soldering legs are wider than the signal soldering legs TD1 and the detecting soldering leg TCC1 in a transverse direction perpendicular to the vertical direction and the front-rear direction. The leg sections 52 of the latch and the grounding soldering leg TG1(T) are commonly exposed to recess 124 for enlarger welding space. The first surface 120 further intentionally defines tine slits 125 beside the power soldering leg and the grounding soldering leg so as to allow solder material to be filled therein to join the corresponding leg sections, and to join the corresponding leg sections together when a soldering process is applied through a hot bar.

Figure 8:
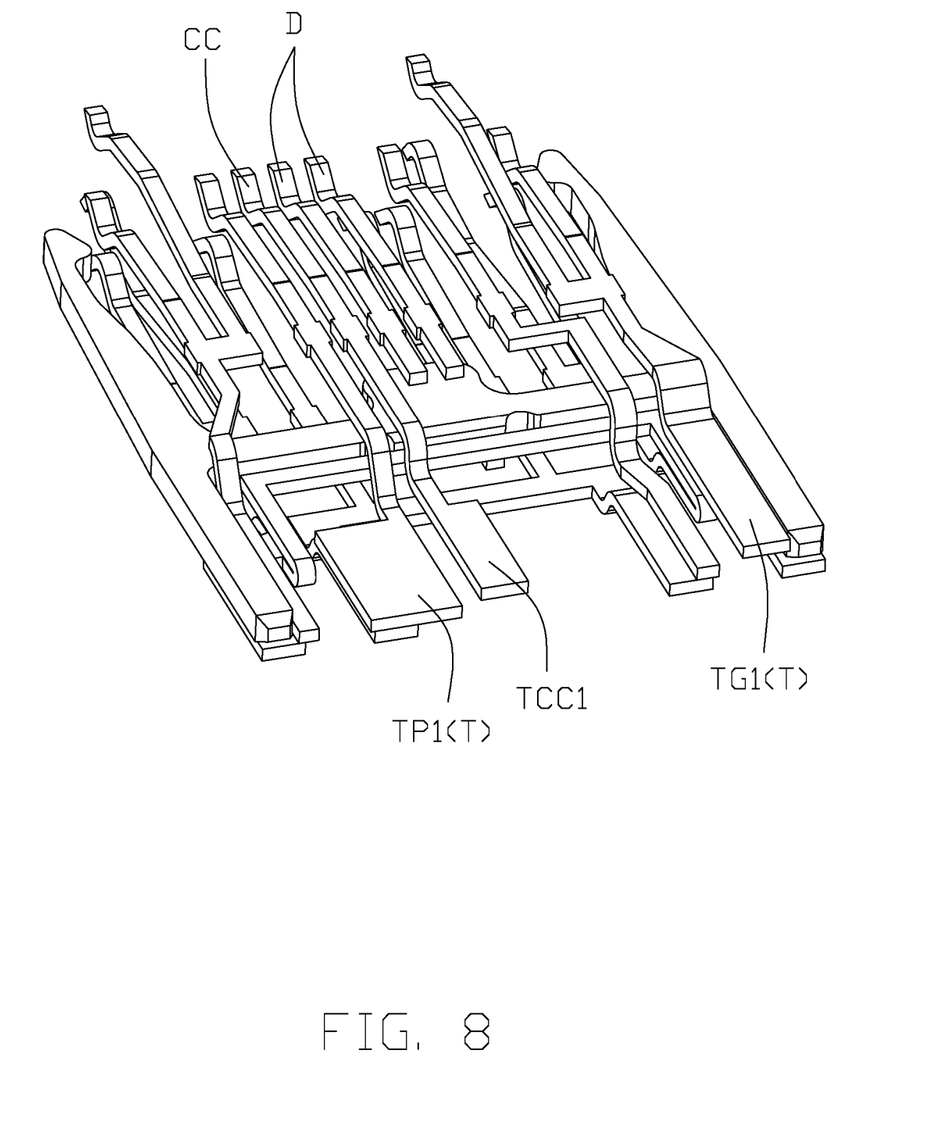
FIG. 8 is a perspective view of the terminals and the metallic latch.
Figure 9:
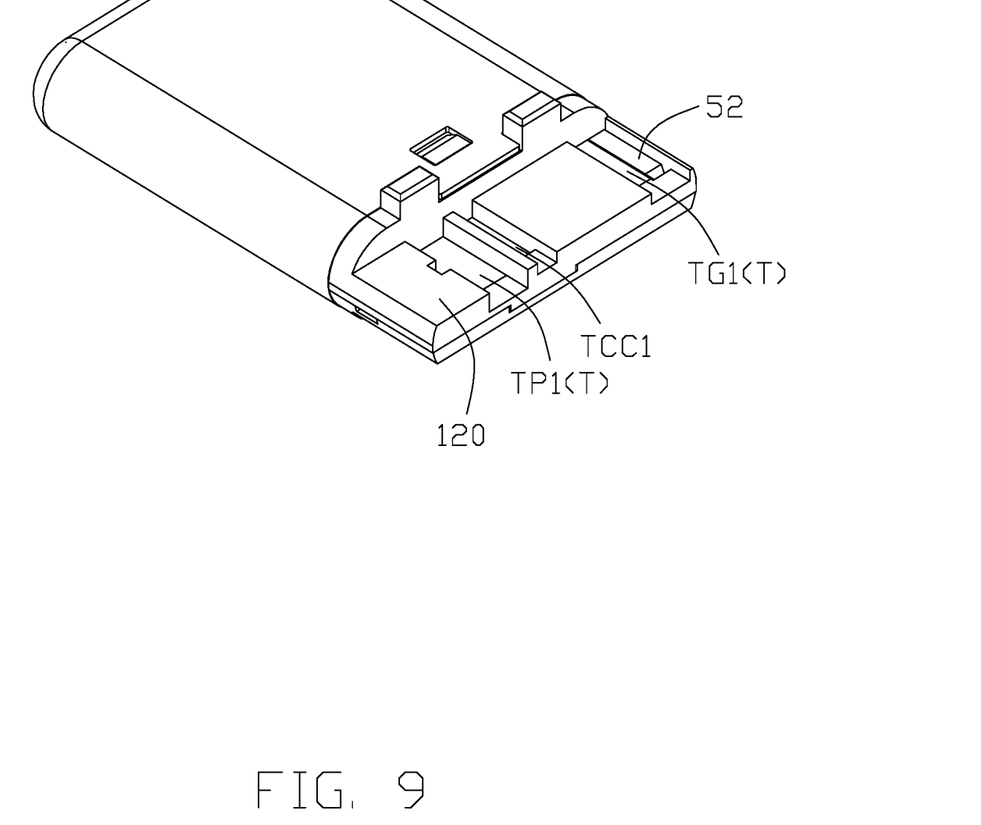
FIG. 9 is a rear and top perspective view of the connector body in FIG. 7.
Figure 10:
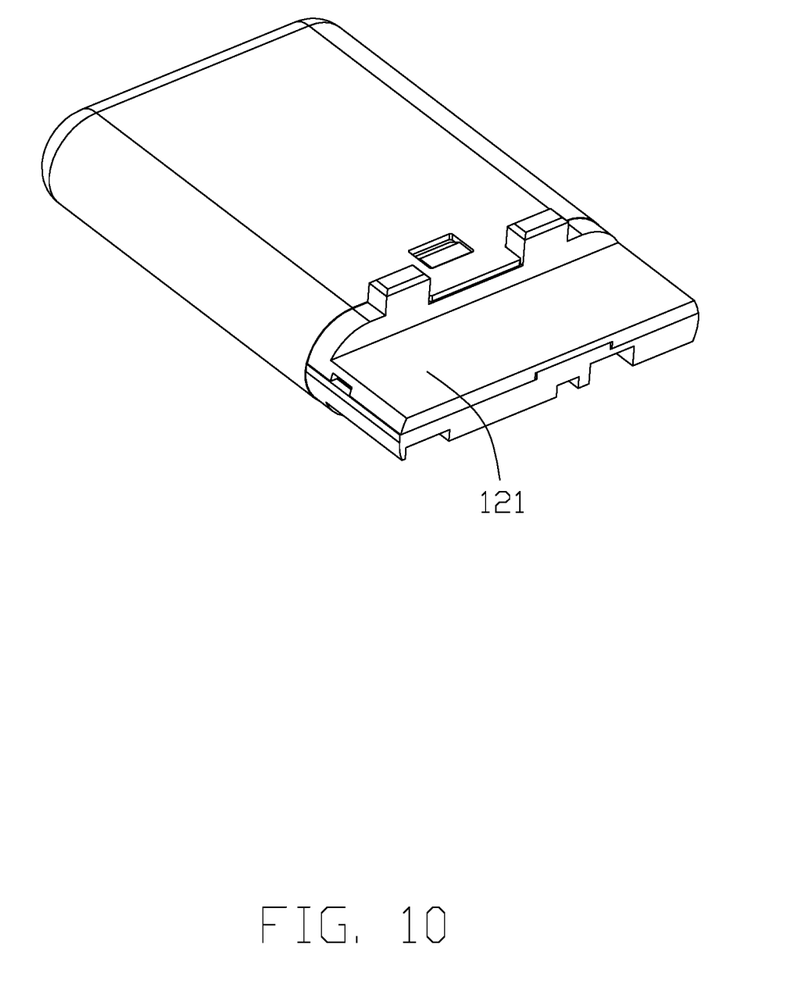
FIG. 10 is a rear and bottom perspective view of the connector body as shown in FIG. 9.
Figure 11:
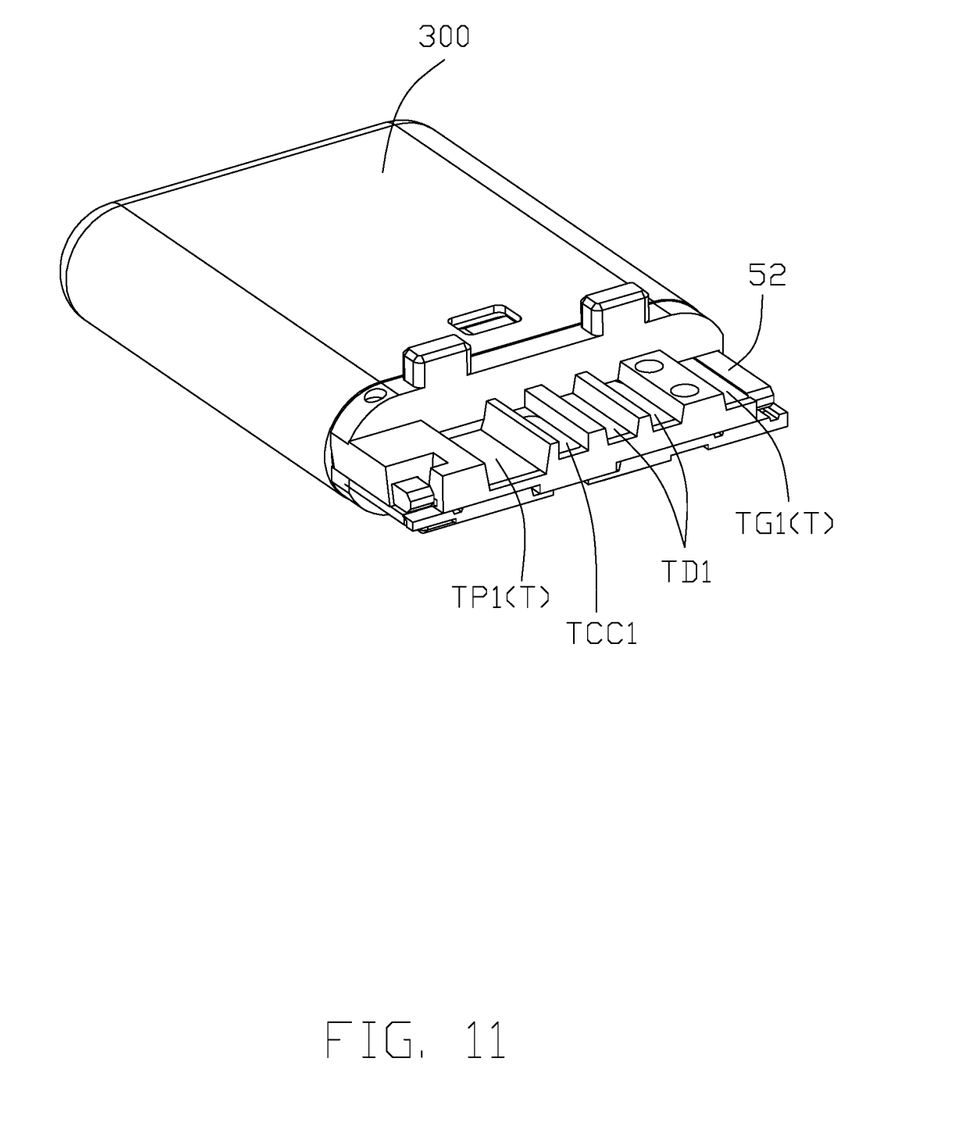
FIG. 11 is a rear and top perspective view of a plug body of a plug connector of a third embodiment of the instant invention.
Figure 12:
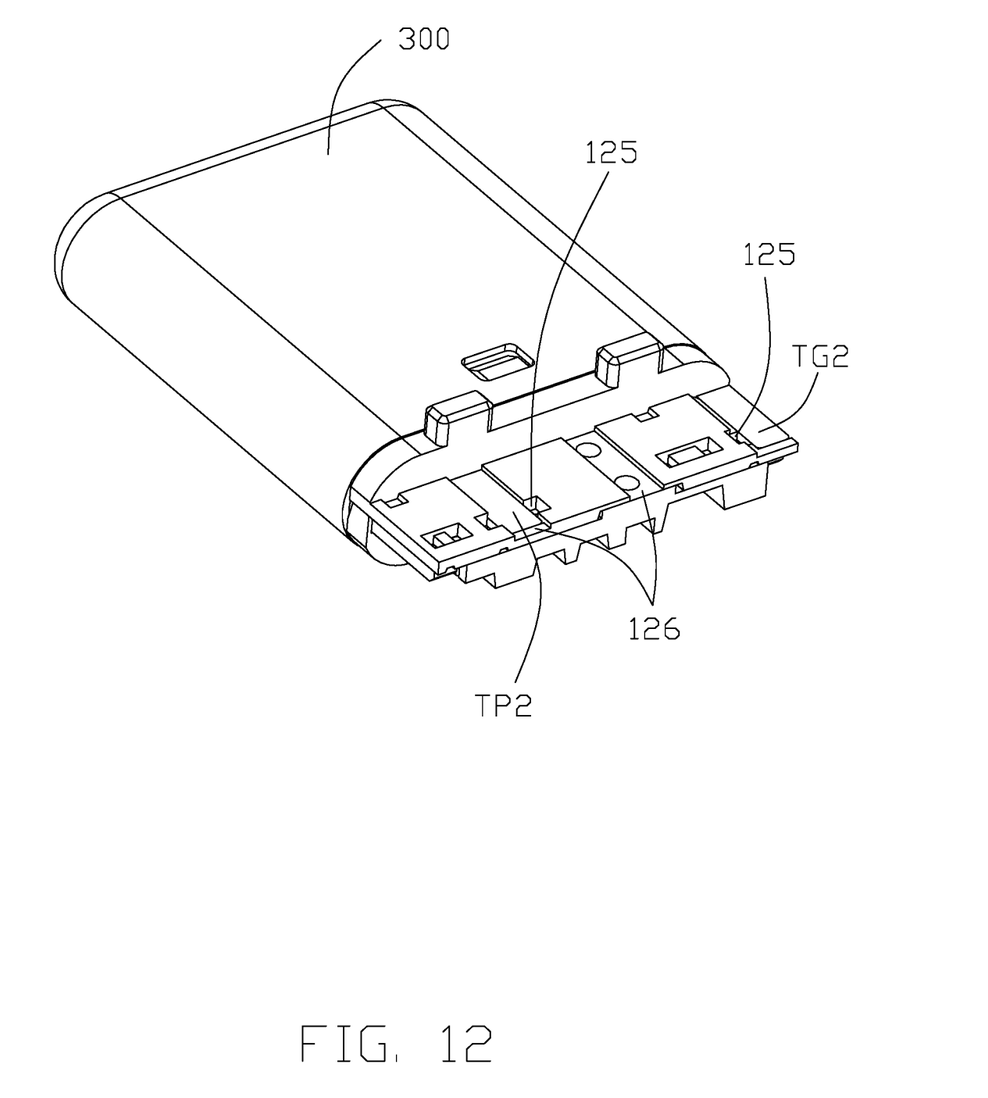
FIG. 12 is a rear and bottom perspective view of the plug body in FIG. 11.
Figure 13:
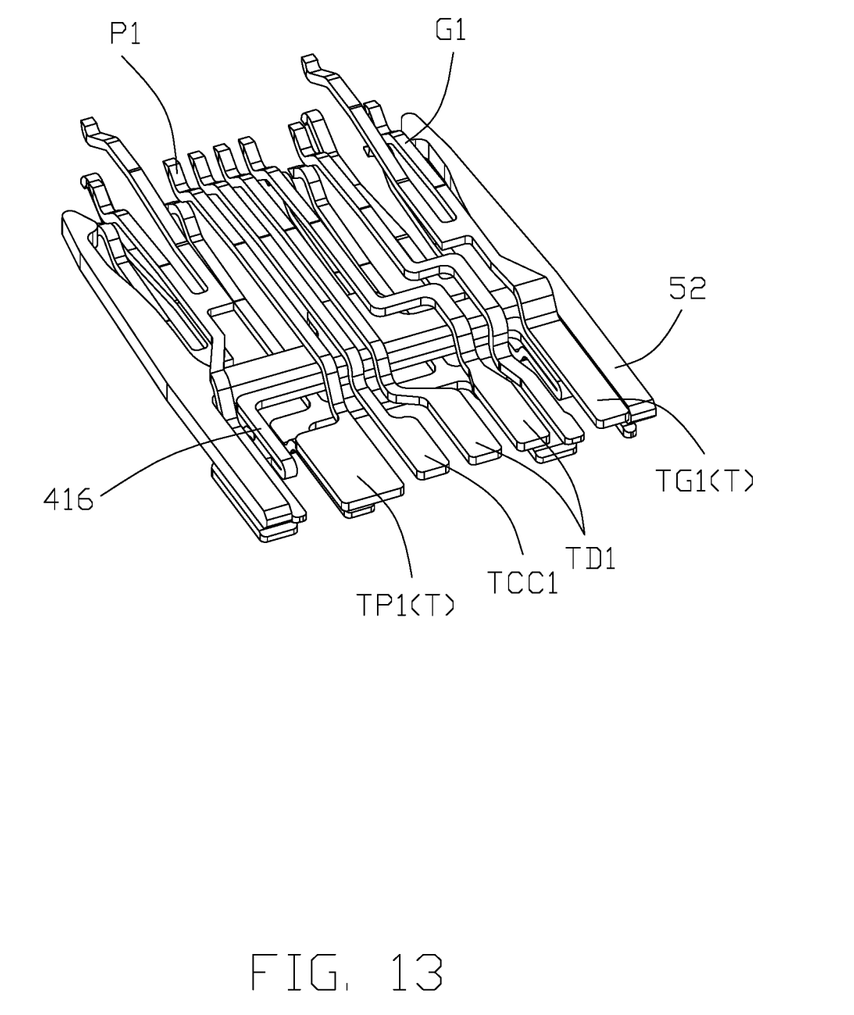
FIG. 13 is a rear and top perspective view of the terminals and the metallic latch of the connector body in FIG. 11.
Figure 14:
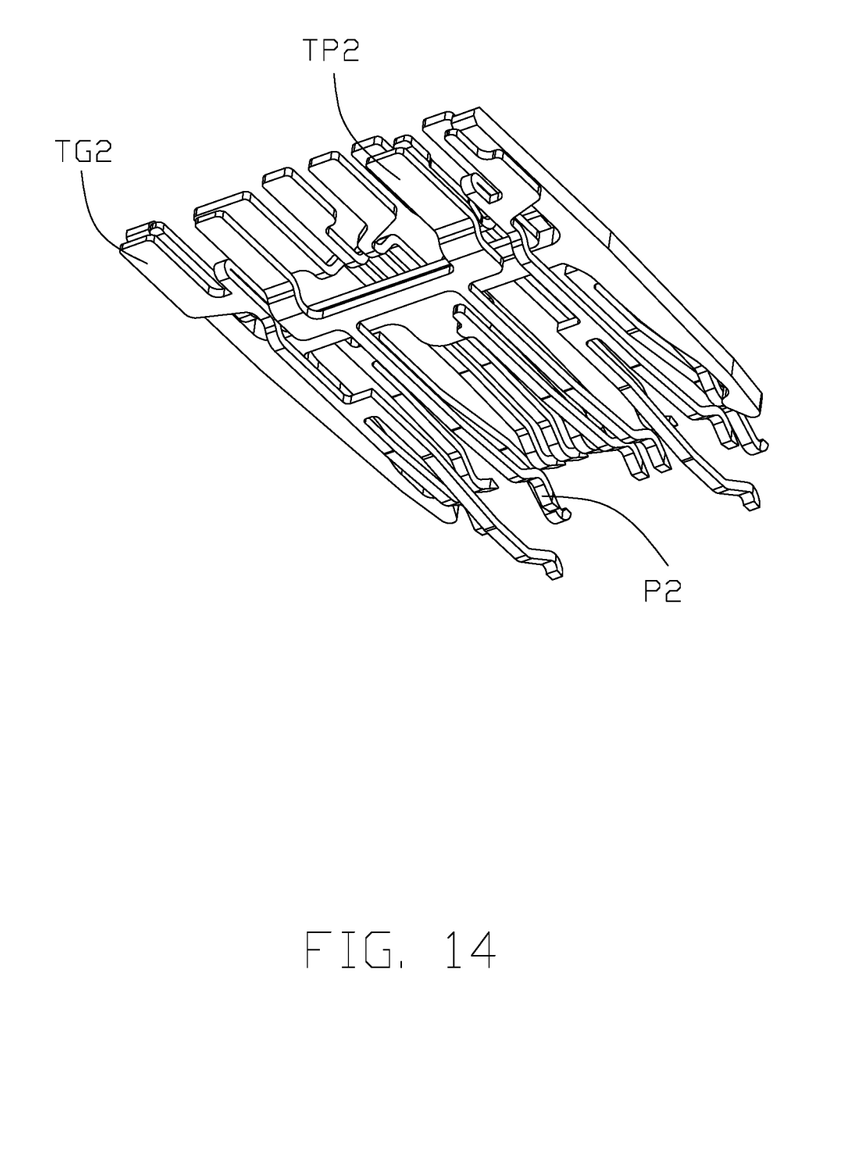
FIG. 14 is a rear and bottom perspective view of the terminals and the metallic latch of the connector body in FIG. 11.

FIGS. 7 through 10 illustrate a second embodiment of a plug connector 200 which is similar to the plug connector 100 of the first embodiment. The first surface 120 is only exposed with a power soldering leg TP1(T), a grounding soldering leg TG1(T) and a detecting soldering leg TCC1, while the second surface 121 has no soldering legs exposed. The plug connector 200 is adapted for transmission larger power which is omitted the pair of the USB 2.0 signal terminals. As shown in FIG. 8, the connector body 10 only has the signal contacting sections D without any leg sections.

FIGS. 11 through 14 illustrate a third embodiment of a plug connector 300 which is similar to the plug connector 100 of the first embodiment. The first surface 120 is exposed with a pair of signal soldering legs TD1, a power soldering leg TP1(T), a grounding soldering leg TG1(T) and a detecting soldering leg TCC1, and the second surface 121 is exposed with a grounding leg section TP2 and a grounding leg section TG2. The second power and grounding leg sections on the second surface 121 is not used to be connected with wires of the cable or a resistor, therefore, those second power and grounding leg sections are not defined as soldering legs connecting with the cable. The second surface 121 further intentionally defines some tine slits 125 beside the second power leg section and the second grounding leg section so as to allow solder material to be filled therein to join the corresponding leg sections, and to join the corresponding leg sections together when a soldering process is applied through a hot bar. Compared with connector bodies 10 of the first and second embodiment of which the second surface 121 is whole filled with resin material without any slots, the slits 125 and the exposed leg sections benefit to manufacture of the connector body and the steady connecting of all the power/grounding leg sections. The second surface 121 further defines shallow recesses 126, but the shallow recesses 126 are not enough larger to receive the wires of the cable. Alternatively, other leg sections also can be exposed to the second surface, but said other leg sections has no functions of soldering legs.

However, the disclosure is illustrative only, changes may be made in detail, especially in matter of shape, size, and arrangement of parts within the principles of the invention.

What is claimed is:

1. A plug connector comprising:
a connector body defining a front mating cavity with a first inner side and a second inner side opposite to the first inner side, and a rear cable supporting platform with a first surface and a second surface opposite to the first inner side;
a plurality of terminals comprising two rows of contacting sections arranged along the first and second inner sides of the mating cavity and soldering legs extending to the platform to be welded to a cable;
wherein the soldering legs are arranged in one row and exposing to the first surface of the platform while the second surface of the platform has no soldering legs to be welded to the cable;
wherein the soldering legs comprises one power soldering leg, one detecting soldering leg and one grounding soldering leg, the power soldering leg and the grounding soldering leg are located at opposite sides of the detecting soldering leg;
wherein the soldering legs further comprises a pair of USB 2.0 signal soldering legs, the pair of signal soldering legs are located between the detecting soldering leg and the grounding soldering leg.

2. The plug connector as claimed in claim 1, further comprising a metallic latch, wherein the latch comprises a pair of side arms and a leg section, the leg section is abutted against the grounding soldering leg in a side by side pattern.

3. The plug connector as claimed in claim 1, wherein the first inner side of the mating cavity and the first surface of the platform are located at a same side of the connector body.

4. The plug connector as claimed in claim 1, wherein the second surface is exposed with a power leg section and a grounding leg section extending from corresponding contacting sections, which leave unused.

5. The plug connector as claimed in claim 1, wherein the first surface defines a plurality of recesses, the soldering legs are flushed with inner bottoms of the recesses and wires of the cable are received in the recesses.

6. The plug connector as claimed in claim 1, wherein the contacting sections comprises a pair of first power contacting sections, a pair of grounding contacting sections and a detecting contacting section located on the first inner side of the mating cavity, and a pair of second power contacting sections and a pair of grounding contacting section located on the second inner side of the mating cavity; the firs and second power contacting sections are electrically joined together and simplify to said one power soldering leg; the firs and second grounding contacting sections are electrically joined together and simplify to said one grounding soldering leg; the detecting soldering leg extends from the detecting contacting section; the first and the second power contacting sections are aligned with each other in a vertical direction, the first and the second grounding contacting sections are aligned with each other in the vertical direction.

7. The plug connector as claimed in claim 6, wherein the cable only comprises one power wire, one grounding wire and one detecting wire welded to corresponding soldering legs on the first surface of the platform.

8. The plug connector as claimed in claim 6, wherein the contacting sections further comprises a pair of USB 2.0 contacting sections, the soldering legs further comprises a pair of USB 2.0 soldering legs respectively extending from the corresponding USB 2.0 contacting sections.

9. The plug connector as claimed in claim 8, wherein the cable only comprises one pair of USB 2.0 signal wires, one power wire, one grounding wire and one detecting wire welded to corresponding soldering legs on the first surface of the platform.

10. A plug connector adapted for connecting with a cable, comprising;
a connector body defines defining a front mating cavity and a rear cable supporting platform with opposite first and second supporting surfaces;
a plurality of terminals comprising contacting sections located at opposite sides of the mating cavity and soldering legs exposed to the supporting platform, the soldering legs comprising a power soldering leg, a grounding soldering legs and a detecting soldering leg, the power soldering leg and the grounding soldering leg being located at opposite sides of the detecting soldering leg;
the first supporting surface of the platform defining a plurality of recesses running rearwards through the platform, the soldering legs being received in the corresponding recesses;
wherein two recesses of the plurality of recesses receiving the power soldering leg and the grounding soldering legs respectively are not only deeper in a vertical direction, but also wider in a transverse direction perpendicular to the vertical direction, than one recess receiving the detecting soldering leg;
wherein the soldering legs are flushed with inner bottoms of the recesses.

11. The plug connector as claimed in claim 10, further including a metallic latch wherein the metallic latch comprises side arms extending in the mating cavity and leg sections, the leg section of the latch is abutted against the grounding soldering leg in a side by side pattern and commonly exposed to a same recess.

12. A plug connector comprising:
a connector body defining a front mating cavity with a first inner side and a second inner side opposite to the first inner side, and a rear cable supporting platform with a first surface and a second surface opposite to the first inner side;
a plurality of terminals comprising two rows of contacting sections arranged along the first and second inner sides of the mating cavity and soldering legs extending to the platform to be welded to a cable;
wherein the soldering legs are arranged in one row and exposing to the first surface of the platform while the second surface of the platform has no soldering legs to be welded to the cable;
wherein the soldering legs comprises one power soldering leg, one detecting soldering leg and one grounding soldering leg, the power soldering leg and the grounding soldering leg are located at opposite sides of the detecting soldering leg;
wherein the contacting sections comprises a pair of first power contacting sections, a pair of grounding contacting sections and a detecting contacting section located on the first inner side of the mating cavity, and a pair of second power contacting sections and a pair of grounding contacting section located on the second inner side of the mating cavity; the firs and second power contacting sections are electrically joined together and simplify to said one power soldering leg; the firs and second grounding contacting sections are electrically joined together and simplify to said one grounding soldering leg; the detecting soldering leg extends from the detecting contacting section; the first and the second power contacting sections are aligned with each other in a vertical direction, the first and the second grounding contacting sections are aligned with each other in the vertical direction.

* * * * *